United States Patent
Blackburn et al.

(10) Patent No.: US 8,160,272 B1
(45) Date of Patent: Apr. 17, 2012

(54) AUDIO OUTPUT CIRCUITS HAVING RAMPED ATTENUATION CIRCUITS THAT INHIBIT POP DISTURBANCES WHEN AUDIO SOURCES ARE SWITCHED

(75) Inventors: Jeffrey Blackburn, Lakeway, TX (US); Ajaykumar Kanji, Austin, TX (US)

(73) Assignee: Integrated Device Technology, Inc., San Jose, CA (US)

( * ) Notice: Subject to any disclaimer, the term of this patent is extended or adjusted under 35 U.S.C. 154(b) by 945 days.

(21) Appl. No.: 12/173,564

(22) Filed: Jul. 15, 2008

(51) Int. Cl.
*H04B 15/00* (2006.01)

(52) U.S. Cl. ............... 381/94.5; 381/107; 381/69

(58) Field of Classification Search .......... 381/56, 381/58, 59, 94.1, 94.5, 104, 109
See application file for complete search history.

(56) References Cited

U.S. PATENT DOCUMENTS

| | | | | |
|---|---|---|---|---|
| 3,800,088 A | * | 3/1974 | Bode | 381/61 |
| 4,306,114 A | * | 12/1981 | Callahan | 381/119 |
| 4,881,123 A | * | 11/1989 | Chapple | 381/104 |
| 6,111,965 A | * | 8/2000 | Lubbe et al. | 381/94.5 |
| 6,154,548 A | | 11/2000 | Bizzan | |
| 6,301,366 B1 | | 10/2001 | Malcolm, Jr. et al. | |
| 6,405,093 B1 | | 6/2002 | Malcolm, Jr. et al. | |
| 6,628,999 B1 | | 9/2003 | Klaas et al. | |
| 2008/0204133 A1 | * | 8/2008 | Fontaine et al. | 330/69 |

OTHER PUBLICATIONS

National Semiconductor, "LM1972 μPot™ 2-Channel 78dB Audio Attenuator with Mute," Nov. 2006, 12 pages.

* cited by examiner

*Primary Examiner* — Wai-Sing Louie
*Assistant Examiner* — Suian Tang
(74) *Attorney, Agent, or Firm* — Myers, Bigel et al

(57) ABSTRACT

An audio output circuit includes a port attenuation circuit, which is configured to convert an abrupt dc voltage offset transition between a pair of audio signals received in sequence at an input thereof into a more gradual transition. This conversion is achieved by performing, in sequence, a ramp-to-mute operation on a first of the pair of audio signals and a ramp-from-mute operation on a second of the pair of audio signals. The ramp-to-mute operation includes ramping an output of the audio output circuit from a dc voltage offset associated with the first of the pair of audio signals to a reference dc voltage offset. The ramp-from-mute operation includes ramping the output of the audio output circuit from the reference dc voltage offset to a dc voltage offset associated with the second of the pair of audio signals. These ramping operations may be performed using voltage steps having uniform step size.

8 Claims, 4 Drawing Sheets

AUDIO OUTPUT CIRCUITS HAVING RAMPED ATTENUATION CIRCUITS THAT INHIBIT POP DISTURBANCES WHEN AUDIO SOURCES ARE SWITCHED

CROSS-REFERENCE TO RELATED APPLICATION

This application is related to U.S. application Ser. No. 12/137,836, filed Jun. 12, 2008, entitled "Cross-Drive Impedance Measurement Circuits for Sensing Audio Loads on CODEC Channels," the disclosure of which is hereby incorporated herein by reference.

FIELD OF THE INVENTION

The present invention relates to integrated circuit devices and, more particularly, to integrated circuit devices used in audio systems.

BACKGROUND OF THE INVENTION

The port output of a conventional CODEC chip provides audio drive signals that are converted into sound by speakers. A simple speaker can be modeled as a resistive and capacitive load. In audio, unwanted pops in the audio signals provided to the speaker can damage the speaker and/or injure an audio listener. To address the problems that may be caused by unwanted pops in audio transmission through speakers, specifications have been developed to define an acceptable pop spec of –65 dBV when measuring a peak time domain signal between 20 Hz and 20 KHz through an A-weighted filter, which mimics the filter function of a human ear.

SUMMARY OF THE INVENTION

An audio output circuit according to embodiments of the present invention includes a port attenuation circuit. This port attenuation circuit is configured to convert an abrupt dc voltage offset transition between a pair of audio signals received in sequence at an input thereof into a more gradual transition. This conversion is achieved by performing, in sequence, a ramp-to-mute operation on a first of the pair of audio signals and a ramp-from-mute operation on a second of the pair of audio signals. In particular, the ramp-to-mute operation includes ramping an output of the audio output circuit from a dc voltage offset associated with the first of the pair of audio signals to a reference dc voltage offset. In contrast, the ramp-from-mute operation includes ramping the output of the audio output circuit from the reference dc voltage offset to a dc voltage offset associated with the second of the pair of audio signals. These ramping operations may be performed using voltage steps having uniform step size.

An audio output circuit according to additional embodiments of the present invention includes a plurality of audio sources having outputs maintained at unequal dc voltage offsets when driven with respective audio signals. An audio signal selection circuit is also provided. This audio signal selection circuit, which is electrically coupled to the outputs of the plurality of audio sources, is configured to route an audio signal from a selected one of the plurality of audio sources to an output thereof. The audio signal from the selected audio source is provided to an input of a port attenuation circuit. The port attenuation circuit is configured to convert an abrupt dc voltage offset transition between a pair of audio signals received in sequence from the audio signal selection circuit into a more gradual transition that meets a pop disturbance threshold.

According to additional aspects of these embodiments of the invention, the port attenuation circuit includes a port attenuation control circuit. This control circuit is configured to generate an active ramp enable signal during an operation to change between selected ones of the plurality of audio sources output by the audio signal selection circuit. The port attenuation circuit may also include an attenuation switch network, which is responsive to the ramp enable signal and an audio signal from the output of said audio signal selection circuit. The port attenuation circuit is configured to convert the abrupt dc voltage offset transition into a more gradual transition that meets a pop disturbance threshold by performing the ramp-to-mute and the ramp-from-mute operations in sequence in the attenuation switch network. The attenuation switch network may include a resistor string having a first terminal electrically coupled by a ramp transmission gate to the output of the audio signal selection circuit and a second terminal electrically coupled a reference voltage.

The attenuation switch network may also include a bypass transmission gate having an input electrically coupled to the output of the audio signal selection circuit and an output electrically coupled to an output of the attenuation switch network. The attenuation switch network may also include a mute transmission gate having an input electrically coupled to the output of the attenuation switch network and an output electrically coupled to the reference voltage.

According to additional embodiments of the present invention, the port attenuation control circuit may be configured to generate a multi-bit count signal in response to a clock signal and a mute signal received by the port attenuation circuit. In particular, the port attenuation control circuit may include a counter configured to generate the multi-bit count signal in response to the mute signal and the clock signal, and a decoder responsive to the multi-bit count signal.

DETAILED DESCRIPTION OF PREFERRED EMBODIMENTS

Figure 1A:
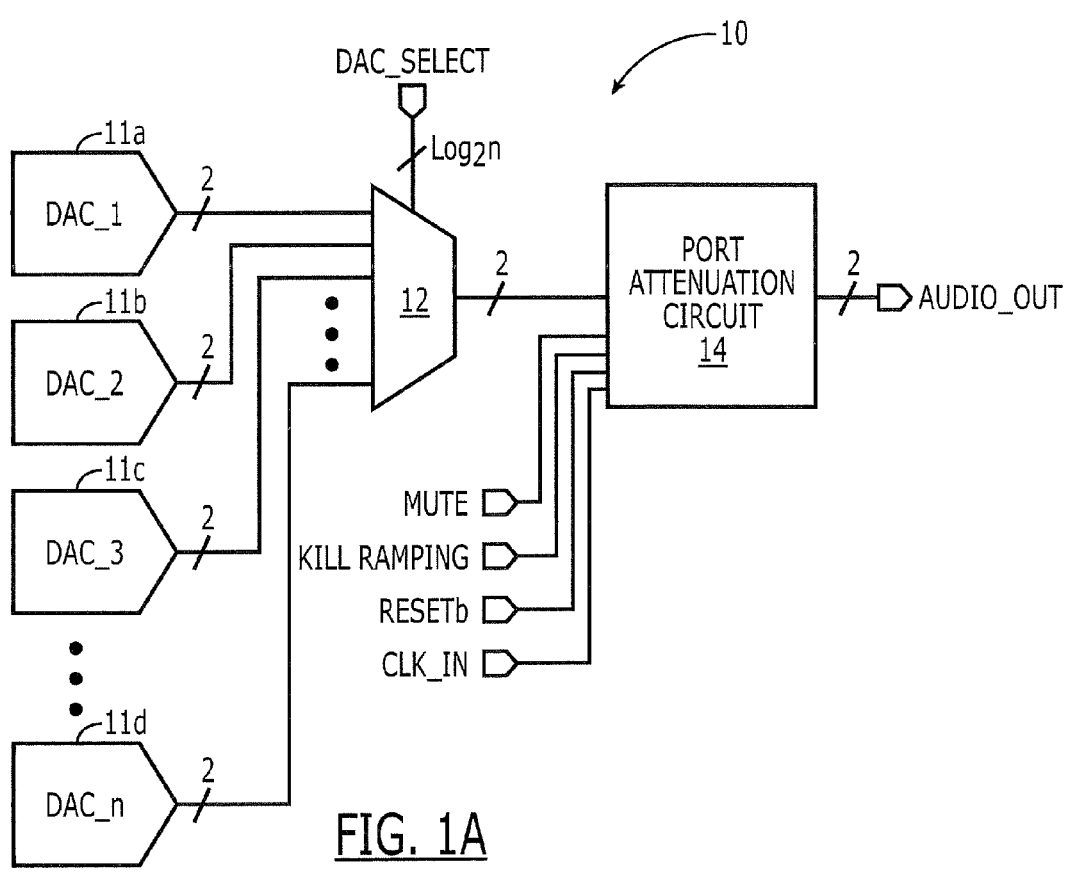
FIG. 1A is a block diagram of an audio output circuit according to an embodiment of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

Figure 1B:
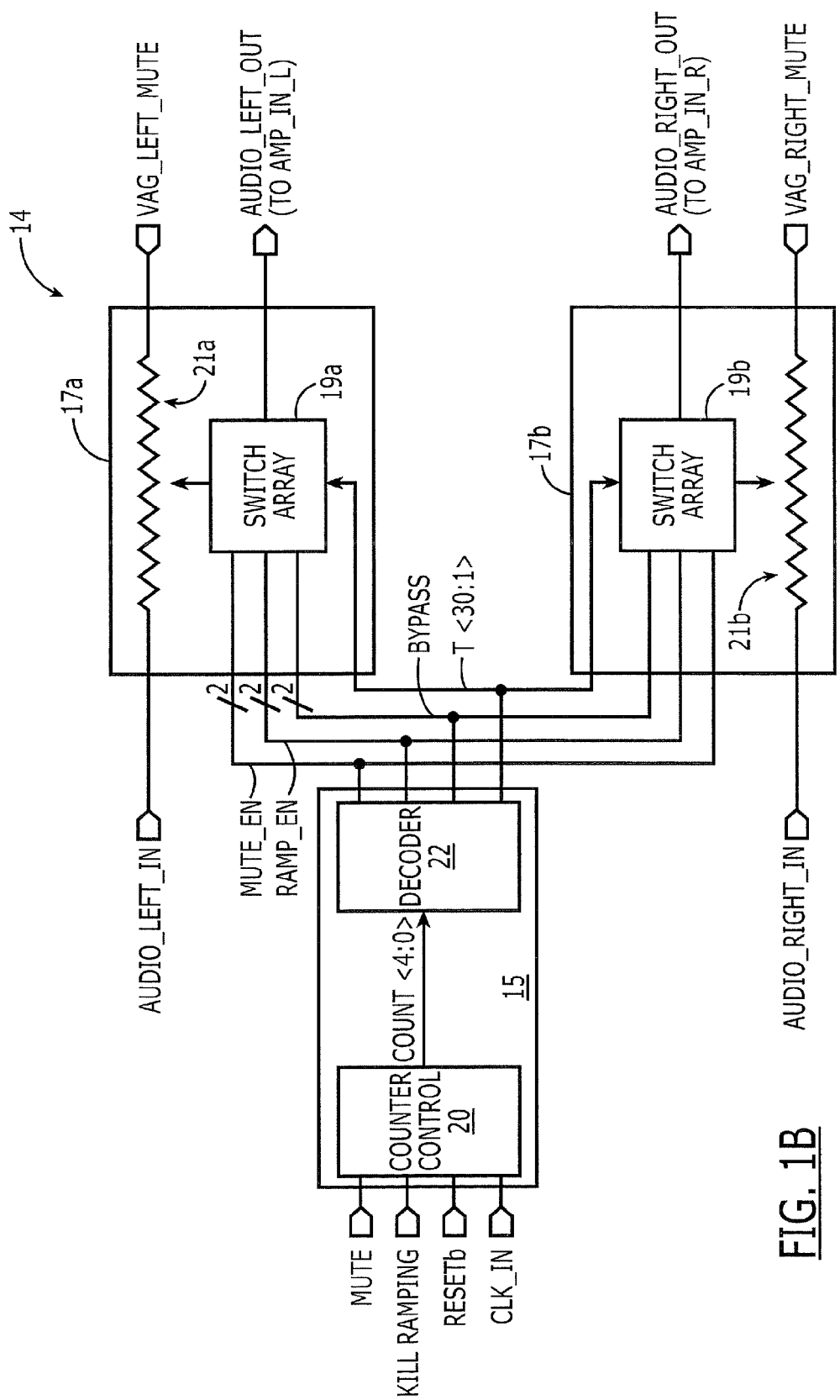
FIG. 1B is a block diagram of a port attenuation circuit according to an embodiment of the present invention.

As illustrated by FIG. 1A, an audio output circuit 10 according to an embodiment of the present invention includes a plurality of audio sources 11a-11d, shown as DAC_1 through DAC_n, an audio signal selection circuit 12 and a port attenuation circuit 14. The audio signal selection circuit 12 is illustrated as an n-input multiplexer, which is responsive to a select signal (DAC_SELECT). The output (i.e., left and right audio signals) of the audio signal selection circuit 12 is provided to an input of the port attenuation circuit 14, which is responsive to a plurality of control signals: MUTE, KILL RAMPING, RESETb and CLK_IN. As illustrated by FIG. 1B, an embodiment of the port attenuation circuit 14 of FIG. 1A includes a port attenuation control circuit 15 and a pair of attenuation switch networks 17a, 17b. The port attenuation control circuit 15 generates a plurality of pairs of signals: MUTE_EN (and MUTE_ENb), RAMP_EN (and RAMP_ENb) and BYPASS (and BYPASSb), which are provided to the attenuation switch networks 17a-17b.

Figure 1C:
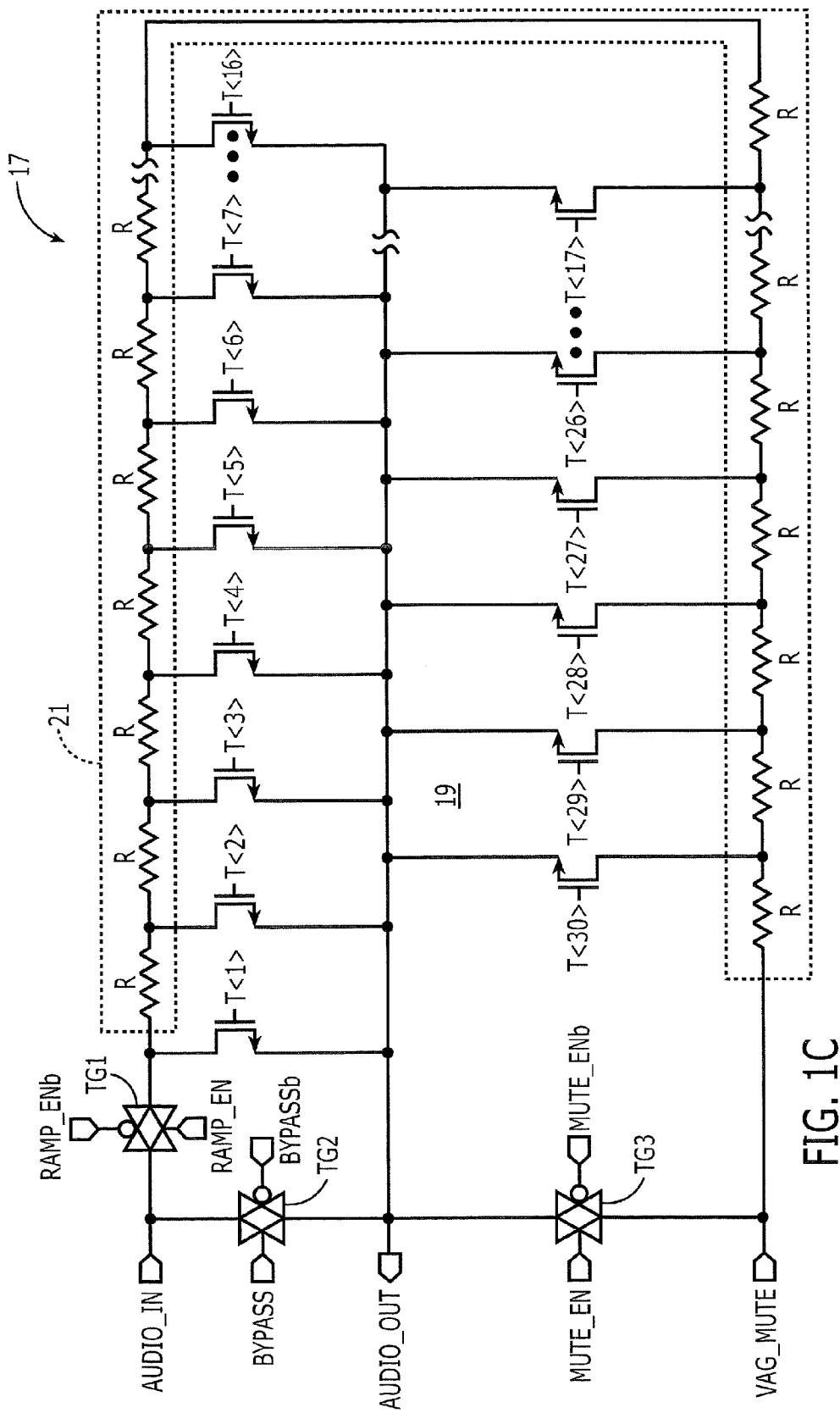
FIG. 1C is an electrical schematic of an attenuation switch network according to an embodiment of the present invention.

The illustrated embodiment of the port attenuation control circuit 15 includes a counter within a counter control circuit 20 and a decoder 22. Moreover, as illustrated by FIG. 1C, each attenuation switch network 17 includes a resistor string 21, which is shown as a string of resistors R of equivalent value, a plurality of transmission gates TG1-TG3, and a switch array 19. Each resistor R may have a value of 1.543K ohms. The switch array 19 is illustrated as including a plurality of NMOS transistors, which are responsive to respective tap signals T<30:1>. The resistor string 21 has a first terminal, which can be electrically coupled to receive a selected "left" or "right" audio signal (AUDIO_IN), and a second terminal electrically coupled to a dc reference voltage (VAG_MUTE).

The counter within the counter control circuit 20 is a 5-bit counter. During power up of the port attenuation circuit 14, the reset signal RESETb is held low until power is fully applied. The mute signal MUTE powers up at an active high level (e.g., logic 1 level) to maintain a mute condition and the kill ramping signal (KILL RAMPING) powers up at an inactive low level (e.g., logic 0 level) to enable voltage ramping. During each power-up event, the output of the counter is held at a full count value of 11111 and the decoder 22 decodes the full count value as T<31>=1 (not shown) and T<30:1>=0. This full count value of 11111 also causes the decoder to generate a pair of complementary mute enable signals (MUTE_EN, MUTE_ENb) from the T<31>=1 signal. This pair of signals activates the mute transmission gate TG3 within the attenuation switch network 17. The activation of the mute transmission gate TG3 within the attenuation switch network 17 electrically couples a dc reference voltage (VAG) at terminal VAG_MUTE to an output terminal (AUDIO_OUT) of the attenuation switch network 17, to thereby maintain an audio mute condition.

Thereafter, to commence operation of the port attenuation circuit 14 after an audio signal has been selected, the counter counts down from 11111 to 00000 in-sync with the clock signal CLK_IN, which may be a 1.75 KHz clock signal. During this count down interval, the output of the decoder 22 transitions according to the following "ramp-from-mute" sequence: (T<30:1>=0), (T<30>=1, T<29:1>=0), (T<29>=1, T<30, 28:1>=0), (T<30:2>=0, T<1>=1). During this sequence, each NMOS transistor within the switch array 19 is sequentially turned on to thereby ramp the dc voltage level at the output (AUDIO_OUT) from the reference voltage (VAG) to the dc offset associated with the selected audio input signal (AUDIO_IN). Moreover, during the two-cycle interval when the counter transitions from 00010 to 00001 and then transitions from 00001 to a terminal value of 00000, the decoder 22 sets the pair of complementary bypass signals (BYPASS, BYPASSb) to values that turn on the bypass transmission gate TG2. The turn on of the bypass transmission gate TG2 directly connects the input AUDIO_IN to the output AUDIO_OUT. The decoder 22 is also configured to turn on the ramp enable transmission gate TG1 and enable the resistor string 21, by setting RAMP_EN=1 and RAMP_ENb=0 whenever the count value is greater than the terminal count value of 00000 and less than a terminal count value of 11111 (i.e., T<31>=1). Based on this configuration of the decoder 22, the bypass transmission gate TG2 and the ramp enable transmission gate TG1 are both enabled during an overlapping time interval when the count value equals 00001 (i.e., T<30:1>=<000000...1>) and the NMOS transistor responsive to T<1> is turned on.

As will now be described, the port attenuation circuit 14 operates to convert an abrupt dc voltage offset transition between a pair of audio signals received in sequence at the input (e.g., AUDIO_LEFT_IN or AUDIO_RIGHT_IN) into a more gradual transition that meets a pop disturbance threshold. This conversion is achieved by performing, in sequence, a ramp-to-mute operation on a first of the pair of audio signals (e.g., left or right audio signal from DAC_1) and a ramp-from-mute operation on a second of the pair of audio signals (e.g., left or right audio signal from DAC_n). The ramp-to-mute operation is performed by switching the mute signal MUTE low-to-high for a predetermined duration that is sufficient to complete all voltage steps within the ramp-to-mute operation. Setting the mute signal MUTE high causes the counter within the counter control circuit 20 to incrementally count up thirty one steps from 00000 to 11111. During the interval from 00001 to 11111, the tap signal T<31:1> transitions from T<1>=1 (T<30:2>=0), T<2>=1 (T<30:3>=T<1>=0), ..., T<31>=1 (T<30:0>=0), and the output AUDIO_OUT transitions in equivalent voltage steps from having a dc voltage equal to the dc offset associated with the first of the pair of audio signals to a dc voltage equal to the reference voltage at terminal VAG_MUTE. At the completion of this ramp-to-mute operation, the mute enable signals MUTE_EN, MUTE_ENb are used to temporarily turn on the mute transmission gate TG3 and the audio signal provided to the input of the port attenuation circuit 14 is changed. The number and size of the voltage steps and the frequency of the clock signal CLK_IN may be chosen to maintain a less than −65 dBV movement at the output AUDIO_OUT. Thereafter, the mute signal MUTE transitions high-to-low to thereby cause the counter within the counter control circuit 20 to count down from 11111 to 00000 during a ramp-from-mute operation. These ramping operations may be bypassed by driving the kill ramping signal KILL RAMPING to an active high level, which causes the counter control circuit 20 to automatically switch the count from any value to 00000 and then hold until the kill ramping signal is deactivated.

Figure 2:
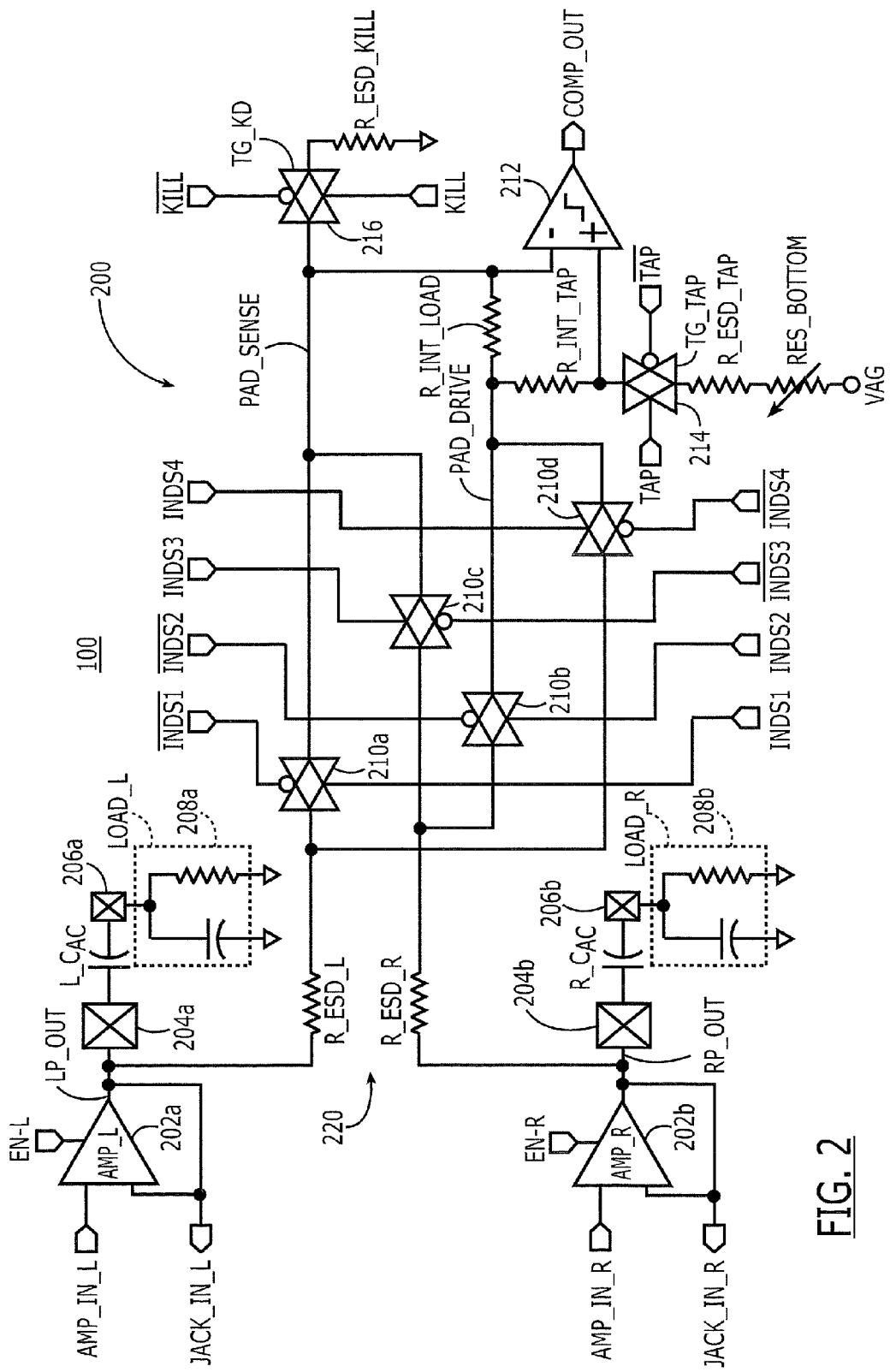
FIG. 2 is an electrical schematic of jack sense circuit according to an embodiment of the present invention.

Referring now to FIG. 2, an audio system 100 according to additional embodiments of the present invention is illustrated as including a CODEC audio jack having a left audio port 206a and a right audio port 206b therein and a jack sense circuit 200, which is electrically coupled to the CODEC audio jack. The jack sense circuit 200 includes a left amplifier/driver 202a, a right amplifier/driver 202b and a cross-drive impedance sensing circuit 220. This cross-drive impedance sensing circuit 220, which is electrically coupled to the left and right audio ports 206a and 206b and the left and right amplifiers 202a and 202b, is configured to detect the resistances of left and right output loads 208a and 208b in order to determine characteristics of a device connected to the CODEC audio jack. The electrical coupling between an output of the left amplifier 202a and the left audio port 206a may be provided through a left terminal/pad 204a of an integrated circuit chip (not shown) containing the jack sense circuit 200. As illustrated, this left terminal/pad 204a may be electrically coupled by an AC coupling capacitor L_$C_{AC}$ to the left audio port 206a. Similarly, the electrical coupling between an output of the right amplifier 202b and the right audio port 206b may be provided through a right terminal/pad 204b. This right terminal/pad 204b may be electrically coupled by an AC coupling capacitor R_$C_{AC}$ to the right audio port 206b. According to some embodiments of the invention, the AC coupling capacitors L_$C_{AC}$ and R_$C_{AC}$ may be board mounted capacitors that are electrically coupled to the CODEC audio jack. Moreover, the connection of an input device (e.g., microphone) to the CODEC audio jack may result to the passing of input signals to the input terminals JACK_IN_L and JACK_IN_R within the audio system 100. These input terminals may be connected to input buffers/drivers (not shown).

The cross-drive impedance sensing circuit 220 is configured to measure a resistance of the left output load 208a in response to a "right" test signal generated by the right amplifier 202b, and is further configured to measure a resistance of a right output load 208b in response to a "left" test signal generated by the left amplifier 202a. The cross-drive impedance sensing circuit may also be configured to disable the left amplifier 202a when measuring the resistance of the left output load 208a and disable the right amplifier 202b when measuring the resistance of the right output load 208b.

According to the embodiments illustrated by FIG. 2, the cross-drive impedance sensing circuit 220 includes a load voltage divider network. This load voltage divider network is configured to establish a left load voltage divider between a common drive node (PAD_DRIVE) of the cross-drive impedance sensing circuit 220 and a left output LP_OUT of the left amplifier 202a when the cross-drive impedance sensing circuit 220 is configured to measure the resistance of the left output load 208a. Alternatively, the load voltage divider network is configured to establish a right load voltage divider between the common drive node (PAD_DRIVE) and a right output RP_OUT of the right amplifier 202b when the cross-drive impedance sensing circuit 220 is configured to measure the resistance of the right output load 208b.

The cross-drive impedance sensing circuit 220 also includes an internal voltage divider network, which is configured to establish an internal voltage divider between the common drive node (PAD_DRIVE) and a reference terminal (e.g., VAG), and a comparator 212 having first and second inputs. These first and second inputs of the comparator 212 are electrically connected to a first intermediate node in the internal voltage divider network and a first intermediate node in the load voltage divider network, respectively. The internal voltage divider network may also include a varistor (RES_BOTTOM) that is varied through multiple trip points when the cross-drive impedance sensing circuit 220 is measuring the resistances of the left and right loads.

Moreover, according to additional embodiments of the invention, the cross-drive impedance sensing circuit may also include a kill drive resistance network that is electrically coupled to a second intermediate node of the load voltage divider network. This second intermediate node is shown as the PAD_SENSE node in FIG. 2. This kill drive resistance network may be enabled when the cross-drive impedance sensing circuit 220 is measuring whether the first and second output loads 208a and 208b are electrically shorted together.

An operation to measure a resistance of the left output load 208a (LOAD_L) includes enabling the right amplifier 202b (EN_R=1) and disabling the left amplifier 202a (EN_L=0) and/or decoupling the left output LP_OUT from the left amplifier 202a. When enabled during a resistance measurement mode of operation, the right amplifier 202b drives the right output RP_OUT with a first AC measurement signal, which may be a −18 dBv signal having a frequency in a range from about 24 kHz to about 30 kHz. This first AC measurement signal is provided to the right terminal/pad 204b and through the right AC coupling capacitor R_$C_{AC}$ to the right audio port 206b and the right output load 208b (LOAD_R). In addition, this first AC measurement signal is provided through the right series resistor R_ESD_R to the common drive node PAD_DRIVE by enabling/disabling a plurality of transmission gates within the cross-drive impedance sensing circuit 220. In particular, the transmission gates 210a-210b are enabled by switching control signals INDS1, INDS2 low-to-high and switching complementary control signals /INDS1 and /INDS2 high-to-low. In addition, the transmission gates 210c-210d are disabled by switching control signals INDS3, INDS4 high-to-low and switching complementary control signals /INDS3 and /INDS4 low-to-high.

The common drive node PAD_DRIVE is electrically connected to the internal voltage divider network, which is illustrated as including a series arrangement of an internal tap resistor R_INT_TAP, a tap transmission gate 214 (TG_TAP), an electrostatic discharge tap resistor R_ESD_TAP and the varistor RES_BOTTOM. The varistor RES_BOTTOM is electrically connected to a reference terminal which receives a reference voltage VAG, which may be a dc voltage having a magnitude of about ½ Vdd, where Vdd is a power supply voltage. This internal voltage divider network is enabled by switching a tap signal TAP low-to-high and the complementary tap signal /TAP high-to-low and thereby turning on the tap transmission gate 214.

The drive node PAD_DRIVE is also connected to the left load voltage divider, which is illustrated as including an internal load resistor R_INT_LOAD, the sense transmission gate 210a and the left series resistor R_ESD_L. To reduce error between tap and load voltage divisions, the resistances should be matched as follows:

R_ESD_L=R_ESD R=R_ESD_TAP
R_INT_TAP=R_INT_LOAD
$R_{TG\_TAP}=R_{TG\ 210a}=R_{TG\ 210c}$

Moreover, to further minimize any potential error caused by variable transmission gate resistances, the tap transmission gate 214 (TG_TAP) should extend between the internal tap resistor R_INT_TAP and the ESD tap resistor R_ESD_TAP in the same manner that the sense transmission gate 210a (or sense transmission gate 210c) extends between the internal load resistor R_INT_LOAD and the left series resistor R_ESD_L (or right series resistor R_ESD_R).

Based on this configuration, the range of load impedances associated with the left output load 208a (LOAD_L) can be determined by varying the value of the resistance provided by the varistor (RES_BOTTOM) through specified resistance trip point values in order to detect changes in the value of the output signal COMP_OUT generated by the comparator 212. The output signal COMP_OUT can then be evaluated to determine the magnitude of the load resistance of the left output load 208a, using conventional techniques.

An operation to measure a resistance of the right output load 208b (LOAD_R) includes enabling the left amplifier 202a (EN_L=1) and disabling the right amplifier 202b (EN_R=0) and/or decoupling the right output RP_OUT from the right amplifier 202b. When enabled during a resistance measurement mode of operation, the left amplifier 202a drives the left output LP_OUT with a second AC measurement signal, which is preferably equivalent to the first AC measurement signal. This second AC measurement signal is provided to the left terminal/pad 204a and through the left AC coupling capacitor L_$C_{AC}$ to the left audio port 206a and the left output load 208a (LOAD_L). In addition, this second AC measurement signal is provided through the left series resistor R_ESD_L to the common drive node PAD_DRIVE by enabling/disabling a plurality of transmission gates within the cross-drive impedance sensing circuit 220. In particular, the transmission gates 210c-210d are enabled by switching control signals INDS3 and INDS4 low-to-high and switching complementary control signals /INDS3 and /INDS4 high-to-low. The transmission gates 210a-210b are also disabled by switching control signals INDS1 and INDS2 high-to-low and switching complementary control signals /INDS1 and /INDS2 low-to-high.

The common drive node PAD DRIVE is connected to the right load voltage divider, which is illustrated as including an internal load resistor R_INT_LOAD, the sense transmission gate 210c and the right series resistor R_ESD_R. Based on this configuration, the range of load impedances associated with the right output load 208b (LOAD_R) can be determined by varying the value of the resistance provided by the varistor (RES_BOTTOM) through specified resistance trip point values in order to detect changes in the value of the output signal COMP_OUT generated by the comparator 212. The output signal COMP_OUT can then be evaluated to determine the magnitude of the load resistance of the right output load 208a.

The cross-drive impedance sensing circuit 220 may also include a kill drive resistance network that is electrically coupled to a second intermediate node of the load voltage divider network (e.g., PAD_SENSE). This kill drive resistance network may be enabled when the cross-drive impedance sensing circuit is measuring whether the left and right output loads 208a and 208b are electrically shorted together. According to the jack sense circuit 200 of FIG. 2, the kill drive resistance network is illustrated as including a kill drive transmission gate 216 (TG_KD), which is responsive to the kill drive control signals KILL, /KILL, and a kill drive resistor R_ESD_KILL. According to some embodiments of the present invention, the kill drive resistor R_ESD_KILL may have a resistance that is substantially less than an closed-state resistance of the kill drive transmission gate 216 (TG_KD) in order to reduce layout area requirements. For example, the kill drive resistor R_ESD_KILL may have a resistance of about 240 ohms and the closed-state resistance of the kill drive transmission gate 216 may be about 20K ohms when the kill drive control signals KILL=1 and /KILL=0.

An operation to measure a resistance of an output load (208a or 208b) may include multiple cycles. During a first cycle to measure whether the left output load 208a is electrically shorted to the right output load 208b, the transmission gates 210b, 210c and 210d are turned off and the transmission gate 210a is turned on. In addition, the kill drive transmission gate 216 is turned on and the varistor RES_BOTTOM is set to a first resistance (e.g., 300 ohms). During this first cycle, the kill drive resistor R_ESD _KILL is driven exclusively by the dc reference signal VAG unless a short is present between the right and left output loads 208a-208b. In particular, this dc reference signal VAG supplies dc current through the resistors RES_BOTTOM, R_ESD_TAP, R_INT_TAP and R_INT_LOAD and maintains the positive input terminal (+) of the comparator 212 at a positive voltage relative to the negative input terminal (−) of the comparator 212, unless a short is present. Moreover, because the reference signal VAG is a dc signal, the capacitor $L\_C_{AC}$ will block dc current flow from the node PAD_SENSE to the left output load 208a.

Nonetheless, if the left and right loads LOAD_L and LOAD_R are shorted together, then the left output LP_OUT will also be driven (indirectly) by the right amplifier 202b. In particular, this right amplifier 202b will drive the left output LP_OUT with the first AC measurement signal (e.g., −18 dBv signal at 24-30 kHz). As illustrated by the cross-drive impedance sensing circuit 220 of FIG. 2, the first AC measurement signal causes an alternating current to pass from the left output LP_OUT through the resistors R_ESD_L and R_ESD_KILL and the transmission gates 210a and 216 (TG_KD). This alternating current causes an alternating voltage to be present on the sense node PAD_SENSE, at the negative input terminal (−) of the comparator 212 and at the output COMP_OUT of the comparator 212. The presence of an alternating square-wave voltage at the output of the comparator 212 reflects the presence of a short between the left and right output loads and the presence of a fixed voltage (e.g., Vdd) at the output of the comparator 212 reflects a lack of a short between the output loads. The presence of the short may identify that a microphone has been plugged into the CODEC audio jack.

Thereafter, during a second cycle to measure the left output load 208a, the transmission gates 210a and 210b are turned on and the transmission gates 210c and 210d are turned off. In addition, the kill drive transmission gate 216 is turned off and the varistor RES_BOTTOM is set to a second resistance (e.g., 2000 ohms). Similarly, during a third cycle, the conditions of the second cycle are maintained, but the varistor RES_BOTTOM is set to a third resistance (e.g., 1,275 ohms). During a fourth cycle, the conditions of the second cycle are maintained, but the varistor RES_BOTTOM is set to a fourth resistance (e.g., 300 ohms). During each of these latter cycles, the output COMP_OUT of the comparator 212 is monitored to detect an appropriate trip point associated with the left output load 208a. However, if the results of the first cycle indicated a short between the output loads, then the results of the second, third and fourth cycles are disregarded.

Thereafter, during an optional first cycle to confirm whether the right output load 208a is electrically shorted to the left output load 208b, the transmission gates 210a, 210b and 210d are turned off and the transmission gate 210c is turned on. In addition, the kill drive transmission gate 216 is turned on and the varistor RES_BOTTOM is set to a first resistance (e.g., 300 ohms). During this first cycle, the kill drive resistor R_ESD_KILL is driven exclusively by the dc reference signal VAG in the event a short is not present between the output loads. This reference signal VAG supplies dc current through the resistors RES_BOTTOM, R_ESD_TAP, R_INT_TAP and R_INT_LOAD and maintains the positive input terminal (+) of the comparator 212 at a positive voltage relative to the negative input terminal (−) of the comparator 212. But, because the reference signal VAG is a dc signal, the capacitor $R\_C_{AC}$ will block dc current flow from the node PAD_SENSE to the right output load 208b.

Nonetheless, if the right and left loads LOAD_R and LOAD_L are shorted together, then the right output RP_OUT will also be driven (indirectly) by the left amplifier 202a. In particular, this left amplifier 202a will drive the right output RP_OUT with the second AC measurement signal (e.g., −18 dBv signal at 24-30 kHz). As illustrated by the cross-drive impedance sensing circuit 220 of FIG. 2, the second AC measurement signal causes an alternating current to pass from the right output RP_OUT through the resistors R_ESD_R and R_ESD_KILL and the transmission gates 210c and 216 (TG_KD). This alternating current causes an alternating voltage to be present on the sense node PAD_SENSE, at the negative input terminal (−) of the comparator 212 and at the output COMP_OUT of the comparator 212. The presence of an alternating square-wave voltage at the output of the comparator 212 reflects the presence of a short between the output loads and the presence of a fixed voltage (e.g., Vdd) at the output of the comparator 212 reflects a lack of a short between the output loads. The presence of the short may verify that a microphone has been plugged into the CODEC audio jack.

A second cycle to measure the right output load 208b may then be performed by turning on the transmission gates 210c and 210d, turning off the transmission gates 210a and 210b, turning off the kill drive transmission gate 216 and setting the varistor RES_BOTTOM to the second resistance (e.g., 2000 ohms). During a third cycle, the conditions of the second cycle are maintained, but the varistor RES_BOTTOM is set to a third resistance (e.g., 1,275 ohms). During a fourth cycle, the conditions of the second cycle are maintained, but the varistor RES_BOTTOM is set to a fourth resistance (e.g., 300 ohms). Again, during each of these cycles, the output COMP_OUT of the comparator 212 is monitored to detect an appropriate trip point associated with the right output load 208b, but is disregarded if a short was previously detected.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An audio output circuit, comprising:
   a plurality of audio sources having outputs maintained at unequal dc voltage offsets when driven with respective audio signals;
   an audio signal selection circuit electrically coupled to the outputs of said plurality of audio sources, said audio signal selection circuit configured to route an audio signal from a selected one of said plurality of audio sources to an output thereof; and
   a port attenuation circuit electrically coupled to the output of said audio signal selection circuit, said port attenuation circuit configured to convert an abrupt dc voltage offset transition between a pair of audio signals received in sequence from said audio signal selection circuit into a more gradual transition that meets a pop disturbance threshold, said port attenuation circuit comprising:
      a port attenuation control circuit configured to generate an active ramp enable signal during an operation to change the selected one of said plurality of audio sources output by said audio signal selection circuit; and
      an attenuation switch network responsive to the ramp enable signal and an audio signal that is output from said audio signal selection circuit;
   wherein the abrupt dc voltage offset transition exceeds the pop disturbance threshold;
   wherein said port attenuation circuit is configured to convert the abrupt dc voltage offset transition into a more gradual transition that meets a pop disturbance threshold by performing ramp-to-mute and ramp-from-mute operations in sequence in said attenuation switch network, said ramp-to-mute and ramp-from-mute operations comprising ramping a first non-zero dc voltage offset associated with a first audio signal to a mute condition and then ramping a dc voltage associated with the mute condition to a second non-zero dc voltage offset associated with a second audio signal, which is unequal to the first non-zero dc offset voltage;
   wherein said attenuation switch network comprises a series string of resistors having a first terminal configured to receive the audio signal output from said audio signal selection circuit during the ramp-to-mute and ramp-from-mute operations and a second terminal electrically coupled a reference voltage; and
   wherein the dc voltage associated with the mute condition is unequal to the first and second non-zero dc voltage offsets.

2. The circuit of claim 1, wherein said port attenuation circuit is further configured to perform the ramp-from-mute operation by ramping the dc voltage associated with the mute condition to the second non-zero dc voltage offset associated with the second audio signal when the second audio signal has a dc signal component but no ac signal component during the ramp-from-mute operation.

3. The circuit of claim 1, wherein the first terminal of the series string of resistors is electrically coupled by a ramp transmission gate to the output of said audio signal selection circuit.

4. The circuit of claim 3, wherein said attenuation switch network further comprises a bypass transmission gate having an input electrically coupled to the output of said audio signal selection circuit and an output electrically coupled to an output of said attenuation switch network.

5. The circuit of claim 4, wherein said attenuation switch network further comprises a mute transmission gate having an input electrically coupled to the output of said attenuation switch network and an output electrically coupled to the reference voltage.

6. The circuit of claim 1, wherein said ramping a first non-zero dc voltage offset associated with a first audio signal to a mute condition comprises ramping the first non-zero dc voltage offset voltage steps having uniform step size.

7. The circuit of claim 6, wherein said port attenuation control circuit is further configured to generate a multi-bit count signal in response to a clock signal and a mute signal received by said port attenuation circuit.

8. The circuit of claim 7, wherein said port attenuation control circuit comprises:
   a counter configured to generate the multi-bit count signal in response to the mute signal and the clock signal; and
   a decoder responsive to the multi-bit count signal.

* * * * *